(12) United States Patent
Beer et al.

(10) Patent No.: US 6,728,147 B2
(45) Date of Patent: Apr. 27, 2004

(54) METHOD FOR ON-CHIP TESTING OF MEMORY CELLS OF AN INTEGRATED MEMORY CIRCUIT

(75) Inventors: Peter Beer, Tutzing (DE); Jochen Kallscheuer, München (DE); Gunnar Krause, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/202,690

(22) Filed: Jul. 24, 2002

(65) Prior Publication Data

US 2003/0021169 A1 Jan. 30, 2003

(30) Foreign Application Priority Data

Jul. 24, 2001 (DE) .......................................... 101 35 966

(51) Int. Cl.[7] ................................................. G11C 7/00
(52) U.S. Cl. ................................... 365/200; 365/189.01
(58) Field of Search ............................. 365/189.01, 200

(56) References Cited

U.S. PATENT DOCUMENTS 4,757,503 A * 7/1988 Hayes et al. ................... 371/21
4,805,093 A * 2/1989 Ward ............................. 364/200
6,198,669 B1    3/2001 Iguchi ...................... 365/189.07

FOREIGN PATENT DOCUMENTS

DE    199 51 534 A1    5/2000

* cited by examiner

*Primary Examiner*—M. Tran
(74) *Attorney, Agent, or Firm*—Laurence A. Greenberg; Werner H. Stemer; Ralph E. Locher

(57) ABSTRACT

A method for on-chip testing of memory cells of a cell array of an integrated memory circuit includes writing different data patterns to memory cells and reading the different data patterns from the memory cells in order to test the memory cells. A basic data pattern is stored in a data word register and read out by applying a data control signal provided by a controller. In addition to the basic data pattern, at least one further data pattern, which differs from the basic data pattern and is stored in a data word register section, is accessed in a targeted manner through the use of the data control signal. As a result the test proceeds rapidly and yields extensive test information.

12 Claims, 1 Drawing Sheet

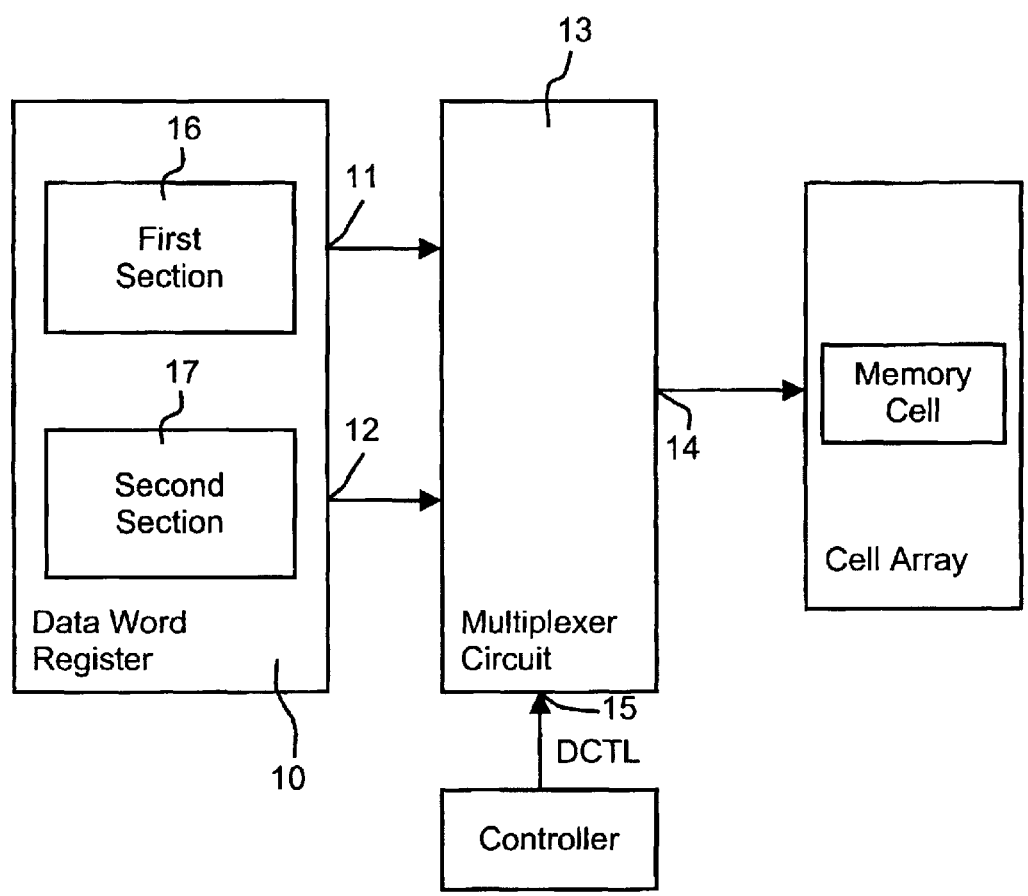

METHOD FOR ON-CHIP TESTING OF MEMORY CELLS OF AN INTEGRATED MEMORY CIRCUIT

BACKGROUND OF THE INVENTION

1. Field of the Invention

The invention relates to a method for on-chip testing of memory cells of a cell array of an integrated memory circuit, in particular of a RAM (Random Access Memory) or a DRAM (Dynamic Random Access Memory). Different data patterns are written to memory cells and read from the memory cells for testing purposes. A basic data pattern is stored in a data word register and read out by applying a data control signal provided by a controller for data control.

Integrated memory circuits realized on semiconductor chips are subjected to tests and repair processes even when they are still on the wafer, in order to determine the quality of the chip, and in order to exclude or repair chips, if appropriate, before continuing with further production steps. For this purpose, in a test mode, test data patterns are written to the cell arrays of the memory circuit and are thereupon read out and checked with regard to their content. By way of example, crosstalk between adjacent memory cells may prove to be critical, for which reason different data patterns, for example, are written to such memory cells.

The above-described method is known for example as a so-called "March" test, which provides for the basic data pattern to be stored in a data register and to be written in a targeted manner to a memory cell to be tested. In the next step, the basic data pattern is firstly inverted and written as inverted basic data pattern to another memory cell to be tested, for example to that cell which is an adjacent cell relative to the first-mentioned memory cell to which the basic data pattern has been written. This test sequence is relatively time-consuming on account of the access and reloading steps required. Moreover, on the basis of the basic data pattern, it only allows the generation of an inverse data pattern with respect thereto for test purposes, so that the data topology available for the test is greatly restricted and is thus meaningful only to a limited extent.

SUMMARY OF THE INVENTION

It is accordingly an object of the invention to provide a method for on-chip testing which overcomes the above-mentioned disadvantages of the heretofore-known methods of this general type and which proceeds more rapidly and whose results are more sound and meaningful than the results of conventional methods.

With the foregoing and other objects in view there is provided, in accordance with the invention, a method for on-chip testing of memory cells of a cell array of an integrated memory circuit, the method includes the steps of:
writing different data patterns including a basic data pattern and at least one further data pattern different from the basic data pattern to memory cells and reading the different data patterns from the memory cells in order to test the memory cells;
storing the basic data pattern in a data word register and reading out the basic data pattern by applying a data control signal provided by a controller for data control; and
storing the at least one further data pattern in a data word register section and accessing, with the data control signal, in addition to accessing the basic data pattern, the at least one further data pattern in a targeted manner.

In other words, a method for on-chip testing of memory cells of a cell array of an integrated memory circuit, in particular of a RAM or DRAM, in which, for test purposes, different data patterns are written to memory cells and read from the latter, of which a basic data pattern is stored in a data word register and read out by application of a data control signal provided by a controller for data control, includes accessing, through the use of the data control signal (DCTL), in addition to the basic data pattern, at least one further data pattern, which differs from the basic data pattern and is stored in a data word register section, in a targeted manner.

In contrast to the method according to the prior art, which provides a test sequence with inversion and frequent reloading of the basic data pattern, the method according to the invention operates on the basis of a plurality of data patterns which can be directly accessed at any time without inversion and reloading. This is advantageous firstly in respect of time and secondly on account of the complex data topology available as a result. It is advantageous, moreover, that the relatively complex data topology can be accessed in a simple manner through the use of the data control signal which, heretofore, has been utilized inter alia for the inversion of the basic data pattern.

More specifically, in accordance with the test method according to the invention, it is provided that through the use of the data control signal, in addition to the basic data pattern, at least one further data pattern which differs from the basic data pattern and is stored in a data word register section is accessed in a targeted manner.

Proceeding from the conventional method sequence with an inversion of the basic data pattern, the method sequence according to the invention is downward compatible since the functionality of the previous method sequence or of the associated hardware is maintained if the data control signal does not load the data pattern which differs from the basic data pattern.

The complexity of the test data topology that can be attained according to the invention can be extended as desired without thereby increasing the test time duration. Proceeding from the basic idea according to the invention, namely of providing a further data pattern independent of the basic data pattern in a manner that allows access through the use of the data control signal, it is provided for this purpose that a plurality of data patterns which differ from the basic data pattern and also differ with respect to one another are stored in a corresponding plurality of data word register sections.

The data word register sections discussed can be implemented in hardware in various ways. Thus, it may on the one hand be provided that the basic data pattern and the data pattern or data patterns which differs or differ from it are stored in separate data word registers. As an alternative to this, it may be provided that the basic data pattern and the data pattern or data patterns which differs or differ from it are stored in data word register sections of a common complex data word register.

In the case where the data word register sections are implemented in separate data word registers, a multiplexer circuit is advantageously provided whose inputs are connected to the outputs of the data word registers in order to apply the data patterns in a targeted manner to memory cells to be tested.

In the case where the data word register sections are implemented in a common complex data word register, it is advantageously provided that the complex data word register has a plurality of outputs in accordance with the plurality of data patterns for separately outputting the data patterns, and in that the data control signal is applied to a multiplexer circuit whose inputs are connected to the outputs of the complex data word register in order to apply the data patterns in a targeted manner to memory cells to be tested.

Other features which are considered as characteristic for the invention are set forth in the appended claims.

Although the invention is illustrated and described herein as embodied in a method for on-chip testing of memory cells of an integrated memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWINGS

The single FIGURE is a block diagram of a complex data word register connected to a multiplexer circuit according to the invention.

DESCRIPTION OF THE PREFERRED EMBODIMENTS

Referring now to the single FIGURE in detail, there is shown a complex data word register 10, provided according to the invention, with two outputs 11 and 12, which are connected to two inputs of a multiplexer circuit 13 having an output 14 and a control input 15.

The complex data word register 10 includes a first section 16, containing a basic data pattern, and a second section 17, containing a data pattern which differs from the basic data pattern and may also be, in principle, the inverse pattern with respect to the basic pattern. When a corresponding loading signal is applied to the control input 15 of the multiplexer circuit 13, which signal is derived from the data control signal DCTL provided by a controller for data control, one of the contents of the first section 16 or of the second section 17, which are present in parallel at the inputs of the multiplexer circuit 13, is optionally output from the latter and via the output 14 thereof and read out into a memory cell of a cell array of a memory circuit. The other content is then read out into a further memory cell during the next access, etc.

The controller for data control which provides the data control signal DCTL is realized on-chip in the memory circuit and has been utilized heretofore for reading out the single basic data pattern from the data word register and inverting it in a second step. This functionality is maintained with implementation of the method according to the invention, which benefits downward compatibility with the previous method procedure in that the data control signal DCTL either, according to the invention, reads out in parallel the contents of the sections 16 and 17 from the complex data word register 10, or, as an alternative to this, only the content from, for example, the first section 16, which is thereupon inverted.

We claim:

1. A method for on-chip testing of memory cells of a cell array of an integrated memory circuit, the method which comprises:

writing different data patterns including a basic data pattern and at least one further data pattern different from the basic data pattern to memory cells and reading the different data patterns from the memory cells in order to test the memory cells;

storing the basic data pattern in a data word register and reading out the basic data pattern by applying a data control signal provided by a controller for data control;

storing the at least one further data pattern in a data word register section and accessing, with the data control signal, in addition to accessing the basic data pattern, the at least one further data pattern in a targeted manner; and storing a plurality of data patterns in a corresponding plurality of data word register sections, the plurality of data patterns being different from the basic data pattern and different with respect to one another.

2. The method according to claim 1, which comprises storing the basic data pattern and the at least one further data pattern in separate data word registers.

3. The method according to claim 1, which comprises storing the basic data pattern and the plurality of data patterns in separate data word registers.

4. The method according to claim 1, which comprises storing the basic data pattern and the at least one further data pattern in data word register sections of a common complex data word register.

5. The method according to claim 1, which comprises storing the basic data pattern and the plurality of data patterns in data word register sections of a common complex data word register.

6. The method according to claim 2, which comprises providing a multiplexer circuit with inputs connected to outputs of the data word registers in order to apply the basic data pattern and the at least one further data pattern in a targeted manner to memory cells to be tented.

7. The method according to claim 3, which comprises providing a multiplexer circuit with inputs connected to outputs of the data word registers in order to apply the basic data pattern and the plurality of data patterns in a targeted manner to memory cells to be tested.

8. The method according to claim 4, which comprises:

providing the complex data word register with a plurality of outputs in accordance with the basic data pattern and the at least one further data pattern for separately outputting the basic data pattern and the at least one further data pattern; and applying the data control signal to a multiplexer circuit having inputs connected to the outputs of the complex data word register in order to apply the basic data pattern and the at least one further data pattern in a targeted manner to memory cells to be tested.

9. The method according to claim 5, which comprises:

providing the complex data word register with a plurality of outputs in accordance with the basic data pattern and the plurality of data patterns for separately outputting the basic data pattern and the plurality of data pattern; and applying the data control signal to a multiplexer circuit having inputs connected to the outputs of the complex data word register in order to apply the basic data pattern and the plurality of data patterns in a targeted manner to memory cells to be tested.

10. The method according to claim 1, which comprises testing memory cells of a random access memory.

11. The method according to claim 1, which comprises testing memory cells of a dynamic random access memory.

12. A method for on-chip testing of memory cells of a cell array of an integrated memory circuit, the method which comprises:

writing different test data patterns including a basic data pattern and at least one further data pattern different from the basic data pattern to memory cells and reading the different data patterns from the memory cells;

storing the basic data pattern and the at least: one further data pattern jointly in a data word register;

reading out the basic data pattern from the data word register and optionally writing the basic data pattern into one of the memory cells to be tested by a multiplex device driven by a data control signal; and reading the further data pattern from the data register and optionally writing the further data pattern into a further memory cell to be tested.

* * * * *